United States Patent
L'Heureux et al.

(10) Patent No.: US 10,435,787 B2
(45) Date of Patent: Oct. 8, 2019

(54) HYDROGEN PARTIAL PRESSURE CONTROL IN A VACUUM PROCESS CHAMBER

(71) Applicant: Applied Materials, Inc., Santa Clara, CA (US)

(72) Inventors: James L'Heureux, Santa Clara, CA (US); Hari K. Ponnekanti, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 15/806,600

(22) Filed: Nov. 8, 2017

(65) Prior Publication Data

US 2018/0135171 A1     May 17, 2018

Related U.S. Application Data

(60) Provisional application No. 62/421,609, filed on Nov. 14, 2016.

(51) Int. Cl.
| | |
|---|---|
| C23C 16/22 | (2006.01) |
| C23C 16/455 | (2006.01) |
| C23C 16/505 | (2006.01) |
| C23C 16/511 | (2006.01) |
| C23C 16/52 | (2006.01) |

(Continued)

(52) U.S. Cl.
CPC .......... *C23C 16/455* (2013.01); *C23C 16/401* (2013.01); *C23C 16/4405* (2013.01); *C23C 16/505* (2013.01); *C23C 16/511* (2013.01); *C23C 16/52* (2013.01)

(58) Field of Classification Search
CPC .......... C23C 16/22; C23C 16/40; C23C 16/00
See application file for complete search history.

(56) References Cited

U.S. PATENT DOCUMENTS

| 5,310,681 A | * | 5/1994 | Rounbehler | ............. | G01N 1/02 |
| | | | | | 436/106 |
| 5,320,821 A | * | 6/1994 | Nagashima | ............. | B01J 23/30 |
| | | | | | 423/584 |

(Continued)

FOREIGN PATENT DOCUMENTS

JP     2000-240554     *     9/2000

OTHER PUBLICATIONS

Finlayson, B.J., et al., "The reaction of hydrogen atoms with ozone as a source of vibrationally excited OH(X2pl)v=9 for kinetic studies". J. Chem. Phys., vol. 74, No. 10, May 15, 1981, pp. 5643-5658.*

(Continued)

*Primary Examiner* — Bret P Chen
(74) *Attorney, Agent, or Firm* — Patterson + Sheridan LLP (57) ABSTRACT

A method for removing one or more processing by-products found in deposition systems, such as in vacuum forelines of vapor deposition systems is provided. The method comprises performing a deposition process to deposit a layer on a substrate positioned in a deposition chamber. Hydrogen-containing by-products are produced in a vacuum foreline fluidly coupled with the deposition chamber during the depositing process. The method further comprises flowing an oxidizing agent gas into the vacuum foreline to react with at least a portion of the hydrogen-containing by-products in the foreline.

20 Claims, 4 Drawing Sheets (51) Int. Cl.
*C23C 16/40* (2006.01)
*C23C 16/44* (2006.01)

(56) References Cited

U.S. PATENT DOCUMENTS

| | | | |
|---|---|---|---|
| 5,453,125 A | 9/1995 | Krogh | |
| 5,489,446 A * | 2/1996 | Matsumoto | C23C 8/10 118/715 |
| 6,156,667 A | 12/2000 | Jewett | |
| 6,291,938 B1 | 9/2001 | Jewett et al. | |
| 6,689,284 B1 * | 2/2004 | Nakasaki | B08B 3/00 134/1.3 |
| 6,888,040 B1 | 5/2005 | Shufflebotham et al. | |
| 7,648,540 B2 * | 1/2010 | Ramakrishna | B01J 7/02 422/209 |
| 8,742,665 B2 | 6/2014 | Lubomirsky et al. | |
| 8,747,762 B2 | 6/2014 | Dickinson et al. | |
| 8,771,538 B2 | 7/2014 | Lubomirsky et al. | |
| 9,230,780 B2 | 1/2016 | Cox et al. | |
| 9,240,308 B2 | 1/2016 | Cox et al. | |
| 9,333,460 B2 | 5/2016 | Radoiu | |
| 9,378,928 B2 | 6/2016 | Zeng et al. | |
| 2008/0305630 A1 * | 12/2008 | Fukuhara | H01L 21/28052 438/664 |
| 2009/0183684 A1 | 7/2009 | Radoiu | |
| 2010/0230053 A1 | 9/2010 | Nishio | |
| 2011/0204023 A1 | 8/2011 | Huh et al. | |
| 2012/0025710 A1 | 2/2012 | Klyuev et al. | |
| 2012/0261587 A1 | 10/2012 | Kellogg et al. | |
| 2012/0279657 A1 | 11/2012 | Srivastava et al. | |
| 2013/0082197 A1 | 4/2013 | Yang et al. | |
| 2013/0284724 A1 | 10/2013 | Cox et al. | |
| 2014/0262033 A1 | 9/2014 | Herbert et al. | |
| 2014/0291139 A1 | 10/2014 | Dickinson et al. | |
| 2014/0312761 A1 | 10/2014 | Tamagaki | |
| 2015/0152551 A1 * | 6/2015 | Yamaguchi | C23C 16/45565 438/785 |
| 2015/0187625 A1 | 7/2015 | Busche et al. | |
| 2015/0357168 A1 | 12/2015 | Dickinson | |
| 2019/0093232 A1 * | 3/2019 | Chatterjee | C23C 16/56 |

OTHER PUBLICATIONS

Chukalovsky, A.A., et al., "Reaction of hydrogen atoms with singlet delta oxygen (O2(a1dg)). Is everything completely clear?" Journal of Physics D: Applied Physics, 49 (2016) 485202 pp. 1-22.*

* cited by examiner

HYDROGEN PARTIAL PRESSURE CONTROL IN A VACUUM PROCESS CHAMBER

CROSS-REFERENCE TO RELATED APPLICATIONS

This application claims benefit of U.S. Provisional Patent Application Ser. No. 62/421,609, filed Nov. 14, 2016, which is incorporated herein by reference in its entirety.

BACKGROUND

Field

Implementations described herein generally relate to methods for removing one or more processing by-products found in deposition systems, such as in vacuum forelines of vapor deposition systems. More specifically, implementations of the present disclosure relate to methods of reducing hydrogen incorporation into deposited films due to hydrogen buildup in the processing chamber during a deposition process.

Description of the Related Art

In some deposition applications, film quality is inversely related to the amount of hydrogen incorporated in the deposited film. The amount of hydrogen incorporated in the deposited film is a strong function of the partial pressure of hydrogen at the surface of the growing layer or deposited layer formed in a deposition chamber. Several common metal and dielectric deposition processes use hydrogen-containing precursors (e.g., $SiH_4$, $Si_2H_6$, $Si_3H_8$, trisilylamine, TEOS, etc.). When these hydrogen-containing precursors react in the deposition chamber, a large amount of hydrogen is released as a by-product of the reaction. Traditional mechanical vacuum pumps rely on moving and static parts to create and maintain a pressure differential across and through the pumps under gas load conditions. These vacuum pumps are typically poor at pumping lighter weight atoms and molecules, such as hydrogen as the gaps between the rotating impeller and casing are too large to trap and move hydrogen further downstream from the processing chamber and are therefore inefficient. This inability to pump hydrogen leads to an increased partial pressure of hydrogen in the processing region of the deposition chamber. As many substrates within a batch are sequentially processed within the deposition chamber, the amount of hydrogen incorporated into the films formed on each sequentially processed substrate also increases.

Thus, there is a need for improved methods and systems for removing gases that are hard to pump, such as hydrogen, from a processing region of a deposition chamber within a deposition system.

SUMMARY

Implementations described herein generally relate to methods for removing one or more processing by-products found in deposition systems, such as in vacuum forelines of vapor deposition systems. More specifically, implementations of the present disclosure relate to methods of reducing the buildup of hydrogen in systems. In one implementation, a method of processing a substrate is provided. The method comprises flowing a reactive gas into a vacuum foreline containing a hydrogen-containing by-product. The method further comprises reacting the reactive gas with at least a portion of the hydrogen-containing by-product in the vacuum foreline to form a reaction product. The reaction product contains a molecule that has a molecular mass greater than a molecular mass of the hydrogen-containing by-product. The method further comprises pumping the reaction product out of the vacuum foreline.

In another implementation, a method of processing a substrate is provided. The method comprises depositing a layer on a substrate disposed in a processing volume of a deposition chamber. Hydrogen-containing by-products are formed within the processing volume during the depositing a layer. The method further comprises evacuating the processing volume using a vacuum pump fluidly coupled to the processing volume by a vacuum foreline. The evacuating the processing volume delivers the hydrogen-containing by-products into the vacuum foreline. The method further comprises flowing a reactive gas into the vacuum foreline. The reactive gas and at least a portion of the hydrogen-containing by-products react in the vacuum foreline to form a reaction product comprising a molecule having a molecular mass higher than a molecular mass of the hydrogen-containing by-products.

In another implementation, a system for processing a substrate is provided. The system comprises a deposition chamber, a vacuum foreline that connects a vacuum pump to the deposition chamber, a reaction chamber fluidly coupled with and positioned along the vacuum foreline in between the vacuum pump and the deposition chamber, a valve to control flow between the deposition chamber and the vacuum foreline, and a reactive gas supply system. The reactive gas supply system comprises at least one reactive gas source, an inlet line that fluidly couples the at least one reactive gas source to the vacuum foreline, and at least one valve connected to the inlet line to control the flow of the reactive gas from the at least one reactive gas source into the vacuum foreline.

In another implementation, a method of processing a substrate in a deposition chamber is provided. The method comprises depositing a layer on the substrate, wherein hydrogen-containing by-products are produced in a vacuum foreline fluidly coupled with the deposition chamber during the depositing process. The method further comprises flowing an oxidizing agent gas into the vacuum foreline to react with at least a portion of the hydrogen-containing by-products in the foreline.

In another implementation, a method of processing a substrate that is disposed in a processing volume of a deposition chamber is provided. The method comprises depositing a layer on the substrate that is disposed in the processing volume, wherein hydrogen-containing by-products are formed within the processing volume during the process of depositing the layer, evacuating the processing volume while depositing the layer on the substrate using a vacuum pump that is fluidly coupled to the processing volume by a vacuum foreline, wherein evacuating the processing volume causes the hydrogen-containing by-products to migrate into the vacuum foreline and flowing a reactive gas into the vacuum foreline to react with at least a portion of the hydrogen-containing by-products in the foreline, wherein the reaction between the reactive gas and the hydrogen-containing by-products forms a molecule that has a high molecular mass than the hydrogen-containing by-product.

In yet another implementation, a system for processing a substrate is provided. The system comprises a deposition chamber for depositing a layer, a vacuum foreline that fluidly couples a vacuum pump to the deposition chamber, a reaction chamber fluidly coupled with and positioned along the vacuum foreline in between the vacuum pump and the deposition chamber, a valve to control flow between the deposition chamber and the vacuum foreline, and an oxidizing agent-containing gas supply system. The oxidizing agent-containing gas supply system comprises at least one oxidizing agent-containing gas source, an inlet line that fluidly couples the at least one oxidizing agent-containing gas source to the vacuum foreline, and at least one valve connected to the inlet line to control the flow of at least one oxidizing agent-containing gas from the at least one oxygen-containing gas source into the vacuum foreline. The oxidizing agent-containing gas is adapted to react with processing by-products in the reaction chamber.

In yet another implementation, a system for processing a substrate is provided. The system comprises a deposition chamber, a vacuum foreline that connects a vacuum pump to the deposition chamber, a plasma source fluidly coupled with and positioned along the vacuum foreline in between the vacuum pump and the deposition chamber, a valve to control flow between the deposition chamber and the vacuum foreline, and a reactive gas supply system. The reactive gas supply system comprises at least one reactive gas source, an inlet line that fluidly couples the at least one reactive gas source to the vacuum foreline, and at least one valve connected to the inlet line to control the flow of the reactive gas from the at least one reactive gas source into the vacuum foreline. A distance between the deposition chamber and the plasma source is between 0 meters and 3 meters.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes systems for removing hydrogen from deposition systems. Certain details are set forth in the following description and in FIGS. 1A-3 to provide a thorough understanding of various implementations of the disclosure. Other details describing well-known structures and systems often associated with deposition systems and pumping systems are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a deposition process that can be carried out using any suitable thin film deposition system. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., of Santa Clara, Calif. Other tools capable of performing deposition processes may also be adapted to benefit from the implementations described herein. In addition, any system enabling the deposition processes described herein can be used to advantage. The apparatus description described herein is illustrative and should not be construed or interpreted as limiting the scope of the implementations described herein.

Figure 1A:
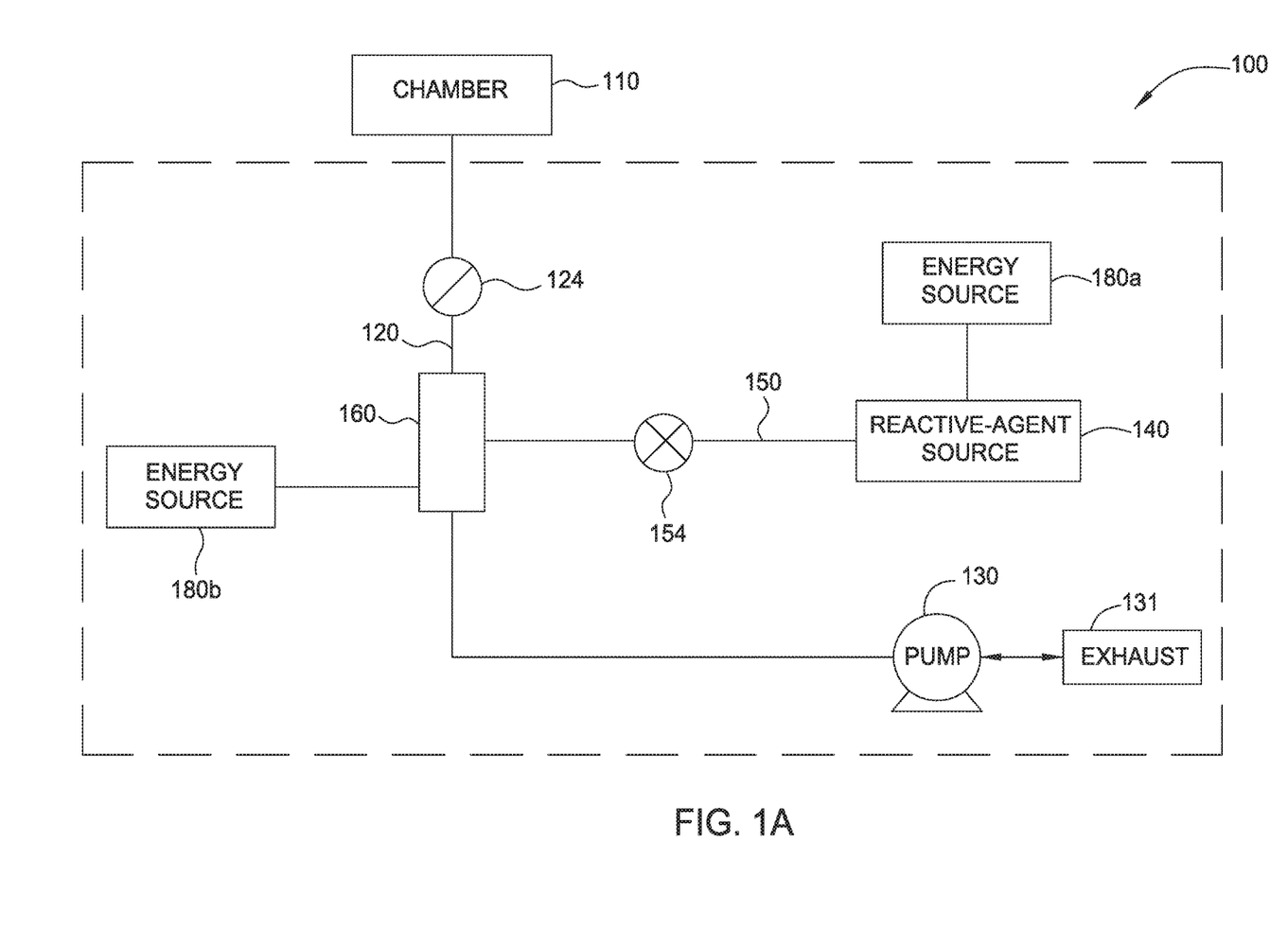
FIG. 1A is a simplified schematic diagram representing one exemplary implementation of a pumping system according to implementations of the present disclosure.
Figure 2:
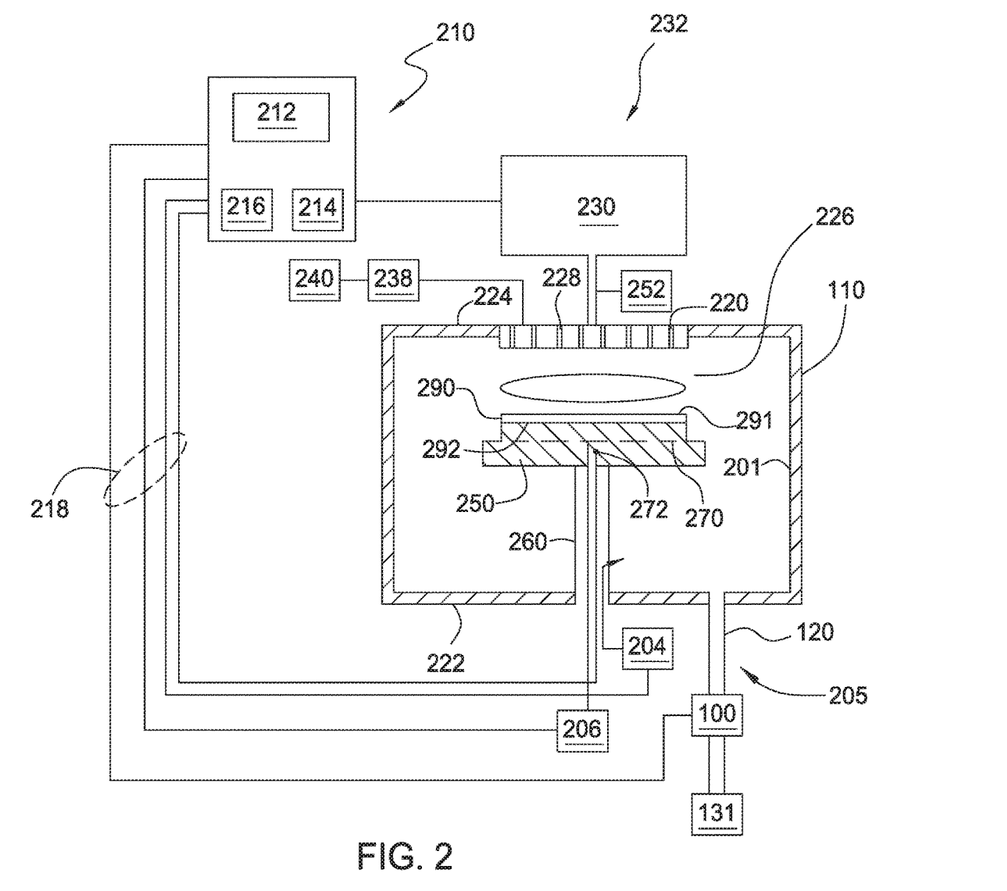
FIG. 2 is a schematic cross-sectional view of a substrate processing system incorporating the pumping system of FIG. 1A, according to implementations of the present disclosure.

For pressures below 100 Torr, where most CVD processes are performed, a hydrogen partial pressure gradient is established along a pumping flow path 205 (FIG. 2). The pumping flow path 205 generally includes a path along which gases flow from the processing volume 226 (FIG. 1A) to the pumping system 100 and out the exhaust 131 (e.g., scrubber or vent) through the vacuum foreline 120. This hydrogen partial pressure gradient is governed by mass transport due to the interaction with other heavier gases in the reaction (in laminar flow regime) and/or diffusion. Diffusion generally becomes more significant at lower pressures where a molecular flow regime is significant. In some implementations of the present disclosure, a larger concentration gradient is created along the pumping flow path by reacting free hydrogen with an oxidizing agent downstream of a deposition chamber to form a heavier by-product that can more easily pumped out by use of a conventional pumping system, such as vacuum pump 130. This heavier by-product (e.g., higher molecular mass) can be more easily pumped away by conventional mechanical vacuum pumps (e.g., roots blower, turbo pump, etc.), ion pumps, cryopumps and getters. In some implementations, free hydrogen is reacted with an oxidizing agent in the vacuum foreline 120. In another implementation, free hydrogen is reacted with the oxidizing agent in a reactor (e.g., reaction chamber 160 in FIG. 1A). The reactor can be positioned inline along the vacuum foreline 120 or on a bypass. In one implementation, at least one of the reactants (e.g., free hydrogen and oxidizing agent) is exposed to an energy source (e.g., ultraviolet ("UV") source, remote RF plasma, capacitively coupled plasma, inductively coupled plasma, transformer coupled plasma (TCP), microwave, thermal energy, etc.) to energize the reactant to form the heavier by-products. In some implementations, the reactant(s) are energized while in the reactor. In another implementation, the reactant(s) are energized prior to entering the reactor and/or vacuum foreline.

FIG. 1A is a simplified schematic diagram representing one exemplary implementation of a pumping system 100 according to implementations of the present disclosure. The pumping system 100 is fluidly coupled with a deposition chamber 110 via a vacuum foreline 120. The deposition chamber 110 is generally configured to perform at least one integrated circuit manufacturing process, such as a deposition process, an etch process, a plasma treatment process, a preclean process, an ion implant process, or other integrated circuit manufacturing process. The deposition chamber 110 may be a vacuum-assisted deposition chamber. The process performed in the deposition chamber 110 may be plasma assisted. For example, the process performed in the deposition chamber 110 may be plasma deposition process for depositing a silicon-based material.

Figure 1B:
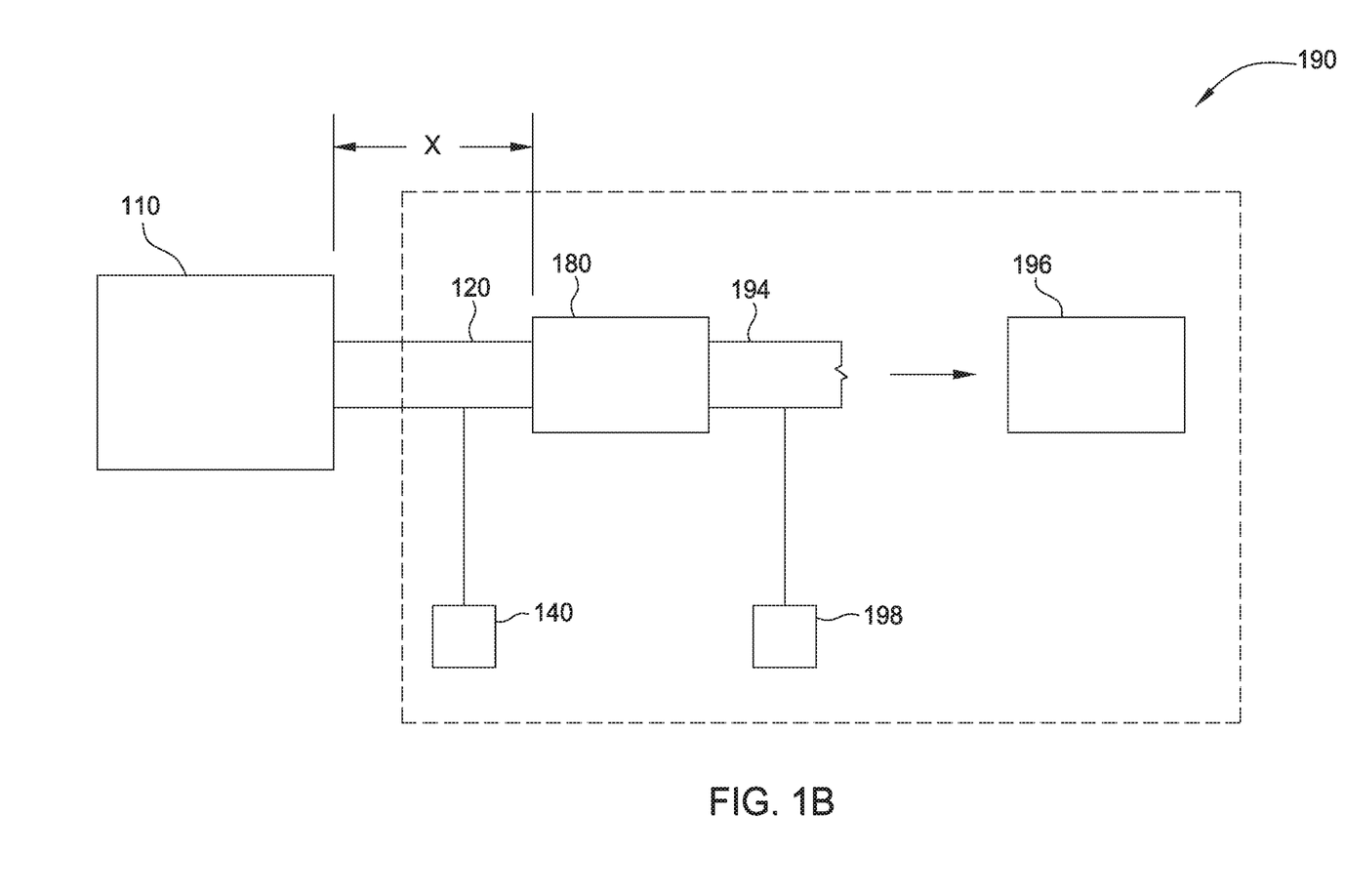
FIG. 1B is another simplified schematic diagram representing one exemplary implementation of a pumping system according to implementations of the present disclosure.

The vacuum foreline 120 is fluidly coupled with the vacuum pump 130. A reactive agent-containing source 140 for supplying a reactive agent (e.g., $O_2$, $O_3$, $N_2O$, $N_2O_2$, or $NF_3$) is fluidly coupled with the vacuum foreline 120. In one implementation, the reactive agent-containing source 140 is fluidly coupled with the vacuum foreline 120 via a reactive agent inlet supply line 150. In one implementation, the reactive agent inlet supply line 150 supplies the oxidizing agent directly to the vacuum foreline 120. In another implementation, the pumping system 100 further includes a reaction chamber 160 for reacting the one or more processing by-products produced by the deposition chamber 110 with the oxidizing agent. In the implementation depicted in FIG. 1A, the reaction chamber 160 is positioned in-line with the vacuum foreline 120 and fluidly coupled with the reactive agent-containing source 140. In another implementation, the reaction chamber 160 is positioned on a bypass fluidly coupled with the vacuum foreline 120. In one implementation, an energy source 180a, 180b (collectively 180) (e.g., UV source, remote RF plasma source, capacitively coupled plasma, inductively coupled plasma, microwave, thermal energy, etc.) is used to enhance the efficiency of the reaction of the reactive materials (e.g., hydrogen-containing by-products and/or oxidizing agent) for energizing at least one of the reactant(s) that is provided to the reaction chamber 160. The energy source 180 may be positioned at other locations within the pumping system 100. For example, in one implementation, the energy source 180a is coupled with the reactive agent-containing source 140. In another implementation, the energy source 180 is positioned along the reactive agent inlet supply line 150. In another implementation, the energy source 180b is coupled with the reaction chamber 160. In yet another implementation, as depicted in FIG. 1B, the energy source 180 is positioned in-line with the vacuum foreline 120. In yet another implementation, the energy source is directly coupled with the deposition chamber 110.

In some implementations, where the energy source 180 is a plasma source, the plasma source may be disposed downstream of the deposition chamber 110. The plasma generated in the plasma source energizes and/or dissociates, partially or fully, the compounds within the effluent coming out of the deposition chamber 110, converting the compounds in the effluent into more benign form.

In one implementation, as illustrated in FIG. 1A, conversion of the one or more processing by-products, such as hydrogen-containing gases (e.g., atomic hydrogen, hydrogen ions, hydrogen radicals, etc.), is performed by delivering the oxidizing agent from the reactive agent inlet supply line 150. The reactive agent inlet supply line 150 is connected to the vacuum foreline 120, which is connected to the deposition chamber 110 (e.g., deposition chamber 110 in FIG. 2).

In general, the one or more processing by-products may include gas molecules, partially reacted precursor materials, un-reacted vapor phase compounds, partially reacted particulate material and/or other reaction by-products. The reactive agent inlet supply line 150 may be connected at one end to the vacuum foreline 120 and at the other end to the reactive agent-containing source 140, which may be adapted to deliver pure oxygen ($O_2$) gas, ozone ($O_3$), nitrous oxide ($N_2O$), dinitrogen dioxide ($N_2O_2$), nitrogen trifluoride ($NF_3$), or combinations thereof. The reactive agent-containing source 140 may alternately or additionally be adapted to deliver other non-oxygen containing gases, such as nitrogen ($N_2$), that are configured to reduce hydrogen to form a hydrogen-containing by-product (e.g., ammonia ($NH_3$)) that has a greater molecular mass. The reactive agent inlet supply line 150 and vacuum foreline 120 may join at a location on vacuum foreline 120 upstream of the vacuum pump 130. In an alternative implementation, the oxidizing agent, or other non-oxygen containing gases, can be ionized or oxygen radicals can be formed by use of the energy source 180 (e.g., UV source, remote RF plasma source) to enhance the efficiency of the reaction of the reactive materials (e.g., hydrogen-containing by-products) in the vacuum foreline 120 and the reactive agent-containing source 140.

In one implementation, a chamber foreline valve 124 is placed at a section of the foreline just downstream of where the vacuum foreline 120 connects to the deposition chamber 110 and upstream of where the vacuum foreline 120 and the reactive agent inlet supply line 150 meet (e.g., reaction chamber 160, if present). The chamber foreline valve 124 is able to control the amount of fluid communication between the deposition chamber 110 and the vacuum foreline 120, and prevent any oxidizing agents, hydrogen, oxygen or other materials from entering and contaminating the deposition chamber 110 from the vacuum foreline 120. The chamber foreline valve 124 may be a throttle valve that is configured to control the gas flow rate in the vacuum foreline 120 and/or pressure within the processing volume 226 of the deposition chamber 110. In one implementation, a valve 154, which may include a pneumatic valve, mass flow controller (MFC) and/or needle valve, is used to control the flow of gases within the reactive agent inlet supply line 150. The pressure of the gases entering the vacuum foreline 120 from the reactive agent-containing source 140 should be high enough so that the reactive gases have an opportunity to react with the hydrogen-containing gases, but not so high as to overwhelm the vacuum pump 130. In one implementation, a mass flow controller can be used instead of a needle valve for valve 154. The valve 154 could be controlled to turn on the oxygen flow for a brief period after each deposition cycle.

During an oxidizing agent purge cycle, the chamber foreline valve 124 is generally closed to prevent reaction or contamination within the chamber. Once the chamber foreline valve 124 is closed, a vacuum will remain in the portion of the vacuum foreline 120 downstream of the chamber foreline valve 124 and any gas present in the vacuum foreline 120 will evenly distribute throughout the volume available in the vacuum foreline 120. In one implementation, the oxidizing agent reacts with the hydrogen-containing by-products in the vacuum foreline 120 that are formed during each deposition cycle performed in the deposition chamber 110. The oxidizing agent reacts with and converts the hydrogen-containing by-products to a heavier by-product that can be pumped away by the vacuum pump 130.

In one implementation, the oxidizing agent purge process is performed between deposition cycles. It should be noted that in other implementations, the oxidizing agent purge process is run during a deposition cycle, while the deposition chamber 110 is in operation, to react with hydrogen-containing by-products formed during the deposition cycle. In such implementations, a negative pressure should be maintained in the vacuum foreline 120 downstream of the reactive agent inlet supply line 150 so that the flow of oxidizing agent-containing gas does not enter and contaminate the deposition chamber 110. The flow of oxidizing agent-containing gas should not be so high as to overwhelm the vacuum pump 130 downstream.

In one implementation, an oxidizing agent (e.g., $N_2O$) is fed into the reactor and energized to nitrogen radicals (N*) and oxygen radicals (O*). The radicals then react with hydrogen in the pumping path to form heavier gases (e.g., $NH_3$ and $H_2O$) which are pumped away. The consumption of hydrogen in the reaction creates a hydrogen concentration gradient from the deposition chamber to the reactor creating a "pull" or "diffusive movement" of hydrogen away from the deposition chamber and towards the vacuum pump 130. From the reactor to the vacuum pump, conventional pumping properties apply, as the by-products (e.g., $NH_3$ and $H_2O$) are heavier gases. At the lower vacuum pressures in the vacuum foreline 120 the movement of hydrogen towards the vacuum pump 130 by a gas flow or viscous drag mechanism is not very effective and thus the movement of hydrogen in the vacuum foreline 120 is largely affected by a diffusion process, whose "flow" rate is governed by the magnitude of the concentration gradient.

FIG. 1B is another simplified schematic diagram representing one exemplary implementation of another pumping system 190 according to implementations of the present disclosure. The pumping system 190 is similar to the pumping system 100 except that energy source 180 is positioned directly in-line with the vacuum foreline 120. The deposition chamber 110 has a chamber exhaust coupled by the vacuum foreline 120 to the energy source 180. In one implementation, the energy source 180 is a plasma source. The exhaust of the energy source 180 is coupled by an exhaust conduit 194 to pumps and facility exhaust, schematically indicated by a single reference numeral 196 in FIG. 1B. The pumps are generally utilized to evacuate the deposition chamber 110, while the facility exhaust generally includes scrubbers or other exhaust cleaning apparatus for preparing the effluent of the deposition chamber 110 to enter the atmosphere.

The energy source 180 is utilized to perform an abatement process on gases and/or other materials exiting the deposition chamber 110 so that such gases and/or other materials may be converted into a more environmentally and/or process equipment friendly composition.

In some implementations, the reactive agent-containing source 140 is coupled to at least one of the vacuum foreline 120 and gases and/or the energy source 180. The reactive agent-containing source 140 provides an abatement reagent into the energy source 180, which may be energized to react with or otherwise assist converting the materials to be exiting the deposition chamber 110 into a more environmentally and/or process equipment friendly composition.

Optionally, a pressure regulating module 198 may be coupled to at least one of the energy source 180 or exhaust conduit 194. The pressure regulating module 198 injects a pressure regulating gas, such as Ar, N, or other suitable gas, which allows the pressure within the energy source 180 to be better controlled, and thereby provide more efficient abatement performance.

In one implementation, the vacuum foreline 120 is not present and the energy source 180 is coupled directly to the deposition chamber 110. A distance between the deposition chamber and the in-line energy source is represented by "x." In one implementation, the distance "x" is between about 0 feet (0 meters) and about 15 feet (about 4.6 meters). In one implementation, the distance "x" is between about 1 foot (0.3 meters) and about 15 feet (about 4.6 meters). In one implementation, the distance "x" is between about 0 feet (0 meters) and about 10 feet (about 3 meters). In another implementation, the distance "x" is between about 1 foot (0.3 meters) and about 10 feet (about 3 meters). In another implementation, the distance "x" is between about 1 foot (about 0.3 meters) and about 5 feet (about 1.5 meters). In another implementation, the distance "x" is between about 5 feet (about 1.5 meters) and about 10 feet (about 3 meters).

FIG. 2 is a schematic cross-sectional view of a substrate processing system 232 incorporating the pumping system 100 of FIG. 1A, according to implementations of the present disclosure. Although not depicted, the pumping system 100 depicted in FIG. 2 may be replaced by the pumping system 190. The substrate processing system 232 includes the deposition chamber 110 coupled to a gas panel 230, a controller 210, and pumping system 100. The deposition chamber 110 generally includes a top wall 224, a sidewall 201 and a bottom wall 222 that define a processing volume 226. A support pedestal 250 is provided in the processing volume 226 of the deposition chamber 110. The support pedestal 250 is supported by a stem 260 and may be typically fabricated from aluminum, ceramic, and other suitable materials. The support pedestal 250 may be moved in a vertical direction inside the deposition chamber 110 using a displacement mechanism (not shown).

The support pedestal 250 may include a heater element 270 suitable for controlling the temperature of a substrate 290 supported on a surface 292 of the support pedestal 250. In one implementation, the heater element 270 is embedded in the support pedestal 250. The support pedestal 250 may be resistively heated by applying an electric current from a power supply 206 to the heater element 270. The heater element 270 may be made of a nickel-chromium wire encapsulated in a nickel-iron-chromium alloy (e.g., INCOLOY®) sheath tube. The electric current supplied from the power supply 206 is regulated by the controller 210 to control the heat generated by the heater element 270, thus maintaining the substrate 290 and the support pedestal 250 at a substantially constant temperature during film deposition. The supplied electric current may be adjusted to selectively control the temperature of the support pedestal 250 between about 100 degrees Celsius to about 700 degrees Celsius.

A temperature sensor 272, such as a thermocouple, may be embedded in the support pedestal 250 to monitor the temperature of the support pedestal 250 in a conventional manner. The measured temperature is used by the controller 210 to control the power supplied to the heater element 270 to maintain the substrate 290 at a desired temperature.

The pumping system 100 is coupled to a port formed in the bottom wall 222 of the deposition chamber 110. The pumping system 100 is used to maintain a desired gas pressure in the deposition chamber 110. As described herein, the pumping system 100 also evacuates post-processing gases and by-products of the process from the deposition chamber 110.

The substrate processing system 232 may further include additional equipment for controlling the chamber pressure, for example, valves (e.g. throttle valves and isolation valves) positioned between the deposition chamber 110 and the pumping system 100 to control the chamber pressure.

The substrate processing system 232 may further include a purge gas source 204 for supplying a purge gas to the processing volume 226.

A showerhead 220 having a plurality of apertures 228 is disposed on the top of the deposition chamber 110 above the support pedestal 250. The apertures 228 of the showerhead 220 are utilized to introduce process gases into the deposition chamber 110. The apertures 228 may have different sizes, number, distributions, shape, design, and diameters to facilitate the flow of the various process gases for different process requirements. The showerhead 220 is connected to the gas panel 230 that allows various gases to supply to the processing volume 226 during process. Plasma is formed from the process gas mixture exiting the showerhead 220 to enhance thermal decomposition of the process gases resulting in the deposition of material on a surface 291 of the substrate 290.

The showerhead 220 and the support pedestal 250 may form a pair of spaced apart electrodes in the processing volume 226. One or more RF power sources 240 provide a bias potential through a matching network 238 to the showerhead 220 to facilitate generation of plasma between the showerhead 220 and the support pedestal 250. Alternatively, the RF power sources 240 and matching network 238 may be coupled to the showerhead 220, support pedestal 250, or coupled to both the showerhead 220 and the support pedestal 250, or coupled to an antenna (not shown) disposed exterior to the deposition chamber 110. In one implementation, the RF power sources 240 may provide between about 100 Watts and about 3,000 Watts at a frequency of about 50 kHz to about 13.6 MHz. In another implementation, the RF power sources 240 may provide between about 500 Watts and about 1,800 Watts at a frequency of about 50 kHz to about 13.6 MHz. Alternatively, plasma is supplied to the processing volume 226 via a remote plasma source 252.

The controller 210 includes a central processing unit (CPU) 212, a memory 216, and a support circuit 214 utilized to control the process sequence and regulate the gas flows from the gas panel 230. The CPU 212 may be of any form of a general-purpose computer processor that may be used in an industrial setting. The software routines can be stored in the memory 216, such as random access memory, read only memory, floppy, or hard disk drive, or other form of digital storage. The support circuit 214 is conventionally coupled to the CPU 212 and may include cache, clock circuits, input/output systems, power supplies, and the like. Bi-directional communications between the controller 210 and the various components of the substrate processing system 232 are handled through numerous signal cables collectively referred to as signal buses 218, some of which are illustrated in FIG. 2.

Deposition Process Example

Figure 3:
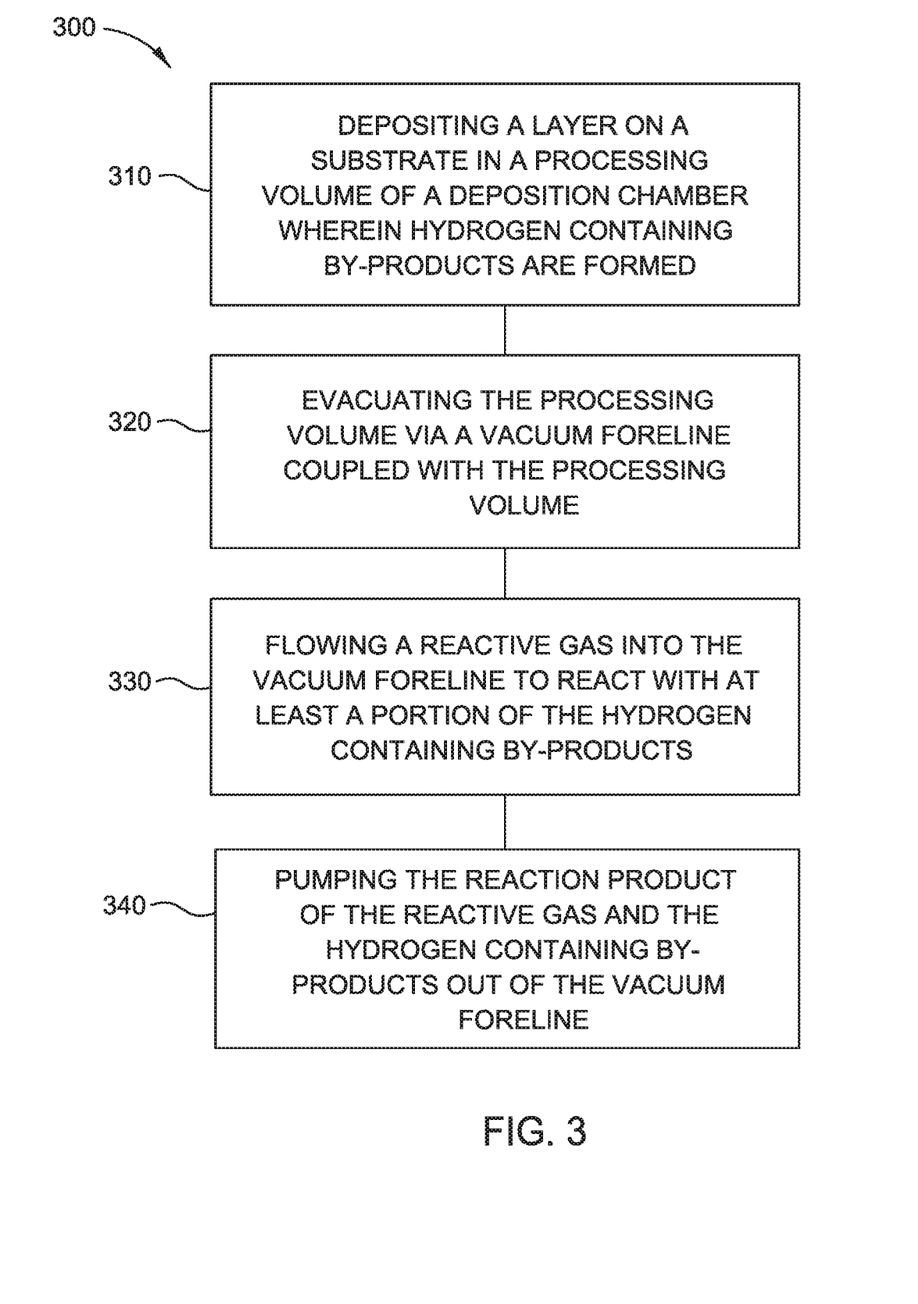
FIG. 3 is a process flow diagram of a method for removing hydrogen gas from a foreline, according to one or more implementations described herein.

FIG. 3 is a process flow diagram of a method 300 for removing hydrogen gas from a foreline, according to one or more implementations described herein. The method 300 may be performed using the pumping system 100, the pumping system 190, and/or the deposition chamber 110.

At operation 310, a layer is deposited on a substrate in a processing volume of a processing chamber. Hydrogen-containing by-products are typically formed during deposition of the layer. In some implementations, the hydrogen-containing by-products are formed in the processing volume of the deposition chamber, a vacuum foreline fluidly coupled with the processing volume, or both the processing volume and the vacuum foreline. In some implementations, the hydrogen-containing by-products comprise atomic hydrogen, hydrogen ions, hydrogen radicals or combinations thereof.

In one example, during processing, after the substrate is placed in the substrate processing system 232, the precursor may be supplied to the processing volume 226, via the showerhead 220, from the gas panel 230. This may include supplying a silicon-containing precursor (e.g., silane, dimethylsilane, trimethylsilane, tetramethylsilane, diethylsilane, tetramethylorthosilicate (TMOS), tetraethylorthosilicate (TEOS), octamethyltetrasiloxane (OMTS), octamethylcyclotetrasiloxane (OMCTS), tetramethylcyclotetrasiloxane (TOMCATS), mixtures thereof, etc.), and other process gases to the processing volume 226. In cases where a silicon oxide (SiOx) material is to be formed, an oxidizing gas and water vapor may also pass through the showerhead and into the processing volume 226. The process may also include the introduction of one or more additional hydroxyl-containing precursors (e.g., $H_2O_2$, etc.) that may be premixed with one or more of the precursors, or separately provided to the process chamber to form a silicon oxide (SiOx) material. In some cases, all the precursors may be premixed before being supplied as one mixture to the processing volume 226. In addition, one or more of the precursors may be mixed with a carrier gas (e.g., an inert gas such as a noble gas (He, Ne, Ar, Kr, and Xe), nitrogen gas, etc.) before being supplied to the chamber.

In this deposition example, hydrogen-containing gases (e.g., atomic hydrogen, hydrogen ions, hydrogen radicals, etc.) will be formed during the silicon oxide formation process due to the breakdown of the silicon-containing precursors, injected water vapor, and hydroxyl-containing precursors, and thus the processes described herein can be used to reduce the concentration of hydrogen-containing gases in the processing volume and thus are incorporated into the deposited film.

At operation 320, the processing volume is evacuated via a vacuum foreline coupled with the processing volume.

At operation 330, a reactive gas flows into the vacuum foreline to react with at least a portion of the hydrogen-containing by-products. In some implementations, the reactive gas flows into the deposition chamber and reacts with the hydrogen-containing by-products in the reaction chamber. In some implementations, gas flow between the deposition chamber and the vacuum foreline is stopped prior to flowing the reactive gas into the vacuum foreline. In some implementations, the reactive gas is an oxidizing agent, a halogen containing agent, or combinations thereof. In some implementations, the reactive gas is an oxidizing agent selected from the group of oxygen ($O_2$) gas, ozone ($O_3$), nitrous oxide ($N_2O$), or combinations thereof. In some implementations, the reactive gas is $NF_3$.

The hydrogen-containing by-products react with the reactive gas to form a heavier by-product that can more easily pumped out by use of a conventional pumping system, such as vacuum pump 130. This heavier by-product (e.g., higher molecular mass) can be more easily pumped away by conventional mechanical vacuum pumps (e.g., roots blower, turbo pump, etc.), ion pumps, cryopumps and getters. In some implementations, free hydrogen is reacted with an oxidizing agent in the vacuum foreline 120.

In some implementations, the reactive gas is energized prior to flowing the reactive gas into the vacuum foreline. In some implementations, the reactive gas is energized in the vacuum foreline. In some implementations, the reactive gas is energized both prior to flowing the reactive gas into the vacuum foreline and while in the vacuum foreline. In some implementations, the reactive gas is energized by exposing the reactive gas to at least one of an ultraviolet source, a remote RF plasma, a capacitively coupled plasma, an inductively coupled plasma, a transformer coupled plasma (TCP), a microwave, thermal energy, or combinations thereof.

At operation 340, the reaction product of the reactive gas and the hydrogen-containing by-product are pumped out of the vacuum foreline.

Implementations of the present disclosure may be used with plasma CVD techniques such as plasma enhanced CVD (PECVD), and high-density plasma CVD (HDPCVD). Implementations include in-situ plasma generation in the process chamber (e.g., between a capacitively coupled showerhead and substrate pedestal/substrate), and/or remote plasma generation using a plasma generator positioned outside the process chamber. Implementations also include thermal CVD techniques such as atmospheric pressure CVD (APCVD), sub-atmospheric CVD (SACVD), and low-pressure CVD (LPCVD), among others.

In summary, some of the benefits of the present disclosure provide systems and methods for improved thin film deposition by reducing the amount of hydrogen present in the processing chamber and the related pumping system. In some of the implementations described herein, lighter hydrogen-containing by-products are converted to heavier by-products, which are removed from the system using conventional pumps.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the present disclosure may be devised without departing from the basic scope thereof, and the scope thereof is determined by the claims that follow.

The invention claimed is:

1. A method of processing a substrate, comprising:
flowing one or more process gases into a processing volume of a processing chamber;
depositing a layer on a substrate disposed in the processing volume of a deposition chamber, wherein a gaseous hydrogen-containing by-product is formed from the one or more process gases within the processing volume during depositing the layer;
flowing a reactive gas into a vacuum foreline coupled with the processing volume, wherein the vacuum foreline contains the gaseous hydrogen-containing by-product;
reacting the reactive gas with at least a portion of the gaseous hydrogen-containing by-product in the vacuum foreline to form a gaseous reaction product, wherein the gaseous reaction product contains a molecule that has a molecular mass greater than a molecular mass of the gaseous hydrogen-containing by-product; and
pumping the gaseous reaction product out of the vacuum foreline.

2. The method of claim 1, wherein the gaseous hydrogen-containing by-product comprises atomic hydrogen, hydrogen ions, hydrogen radicals or combinations thereof.

3. The method of claim 2, wherein the reactive gas is selected from oxygen ($O_2$) gas, ozone ($O_3$), nitrous oxide ($N_2O$), nitrogen trifluoride ($NF_3$), or combinations thereof.

4. The method of claim 3, further comprising energizing the reactive gas.

5. The method of claim 4, wherein energizing the reactive gas comprises exposing the reactive gas to at least one of an ultraviolet source, a remote RF plasma, a capacitively coupled plasma, an inductively coupled plasma, a transformer coupled plasma, a microwave, thermal energy, or combinations thereof.

6. A method of processing a substrate, comprising:
depositing a layer on a substrate disposed in a processing volume of a deposition chamber, wherein gaseous hydrogen-containing by-products are formed within the processing volume during depositing the layer;
evacuating the processing volume using a vacuum pump fluidly coupled to the processing volume by a vacuum foreline, wherein evacuating the processing volume delivers the gaseous hydrogen-containing by-products into the vacuum foreline; and
flowing a reactive gas into the vacuum foreline, wherein the reactive gas and at least a portion of the gaseous hydrogen-containing by-products react in the vacuum foreline to form a gaseous reaction product comprising a molecule having a molecular mass higher than a molecular mass of the gaseous hydrogen-containing by-products.

7. The method of claim 6, wherein the gaseous hydrogen-containing by-products comprise atomic hydrogen, hydrogen ions, hydrogen radicals or combinations thereof.

8. The method of claim 7, wherein the reactive gas is selected from oxygen ($O_2$) gas, ozone ($O_3$), nitrous oxide ($N_2O$), nitrogen trifluoride ($NF_3$), or combinations thereof.

9. The method of claim 6, further comprising energizing the reactive gas prior to flowing the reactive gas into the vacuum foreline.

10. The method of claim 6, further comprising energizing the reactive gas in the vacuum foreline.

11. The method of claim 10, wherein energizing the reactive gas comprises exposing the reactive gas to at least one of an ultraviolet source, a remote RF plasma, a capacitively coupled plasma, an inductively coupled plasma, a transformer coupled plasma, a microwave, thermal energy, or combinations thereof.

12. The method of claim 11, further comprising shutting gas flow between the deposition chamber and the vacuum foreline prior to flowing the reactive gas into the vacuum foreline.

13. The method of claim 6, wherein the reactive gas flows into a reaction chamber fluidly coupled with the vacuum foreline and reacts with the gaseous hydrogen-containing by-products in the reaction chamber.

14. The method of claim 13, wherein the reactive gas is energized in the reaction chamber.

15. The method of claim 6, further comprising pumping the gaseous reaction product of the reactive gas and the gaseous hydrogen-containing by-products out of the vacuum foreline.

16. A method of processing a substrate, comprising:
depositing a layer on a substrate disposed in a processing volume of a deposition system, wherein gaseous hydrogen-containing by-products are formed within the processing volume during depositing the layer and the deposition system comprises:
a deposition chamber defining the processing volume;
a vacuum foreline that connects a vacuum pump to the processing volume of the deposition chamber;

a reaction chamber fluidly coupled with and positioned along the vacuum foreline in between the vacuum pump and the deposition chamber;

a valve to control flow between the deposition chamber and the vacuum foreline; and a reactive gas supply system, comprising:
  at least one reactive gas source;
  an inlet line that fluidly couples the at least one reactive gas source to the reaction chamber; and
  at least one valve connected to the inlet line to control the flow of a reactive gas from the at least one reactive gas source into the reaction chamber;

flowing the reactive gas from the at least one reactive gas source to the reaction chamber, wherein the reactive gas reacts with at least a portion of the gaseous hydrogen-containing by-products in the reaction chamber to form a gaseous reaction product, wherein the gaseous reaction product contains a molecule that has a molecular mass greater than a molecular mass of the gaseous hydrogen-containing by-products; and pumping the gaseous reaction product out of the reaction chamber using the vacuum pump.

17. The method of claim 16, wherein the gaseous hydrogen-containing by-products comprise atomic hydrogen, hydrogen ions, hydrogen radicals or combinations thereof.

18. The method of claim 17, wherein the reactive gas is selected from oxygen ($O_2$) gas, ozone ($O_3$), nitrous oxide ($N_2O$), nitrogen trifluoride ($NF_3$), or combinations thereof.

19. The method of claim 18, further comprising energizing the reactive gas.

20. The method of claim 19, wherein energizing the reactive gas comprises exposing the reactive gas to at least one of an ultraviolet source, a remote RF plasma, a capacitively coupled plasma, an inductively coupled plasma, a transformer coupled plasma, a microwave, thermal energy, or combinations thereof.

* * * * *